United States Patent
Kuo

(10) Patent No.: US 7,355,359 B2
(45) Date of Patent: Apr. 8, 2008

(54) UNIVERSAL APPARATUS FOR DRIVING DIVERSE FANS

(75) Inventor: Shang-Ti Kuo, Taipei (TW)

(73) Assignee: Tyan Computer Corporation, Taipei (TW)

( * ) Notice: Subject to any disclaimer, the term of this patent is extended or adjusted under 35 U.S.C. 154(b) by 126 days.

(21) Appl. No.: 11/435,735

(22) Filed: May 18, 2006

(65) Prior Publication Data

US 2007/0229291 A1    Oct. 4, 2007

(30) Foreign Application Priority Data

Mar. 31, 2006   (TW)   ............... 95111685 A

(51) Int. Cl.
   *H02P 5/00*   (2006.01)
(52) U.S. Cl. .................. 318/268; 700/19; 388/811
(58) Field of Classification Search ........ 318/268; 388/811
   See application file for complete search history.

(56) References Cited

U.S. PATENT DOCUMENTS

| 4,459,519 A | * | 7/1984 | Erdman ............ 318/254 |
| 4,588,934 A | * | 5/1986 | Suzuki et al. ............ 318/449 |
| 5,577,153 A | * | 11/1996 | Bocchiola ............ 388/811 |
| 5,777,817 A | * | 7/1998 | Kim ............ 360/77.14 |
| 2005/0090909 A1 | * | 4/2005 | Wu ............ 700/19 |

* cited by examiner

*Primary Examiner*—Lincoln Donovan
*Assistant Examiner*—Michael Brandt
(74) *Attorney, Agent, or Firm*—Muncy, Geissler, Olds & Lowe, PLLC

(57) ABSTRACT

A universal driving apparatus of a computer system, including a receptacle, a power switch, an integrator and a comparator, is provided to identify and drive a first fan and a second fan. The receptacle connects to the first fan or the second fan for electricity supply and system control. The integrator integrates speed signals of the first fan and the second fan to output an integrated-speed voltage. The comparator compares the integrated-speed voltage and a comparative voltage to output a comparative signal. Accordingly, the computer system uses the comparative signal to identify the fan type and actuate the first fan or the second fan correctly.

12 Claims, 6 Drawing Sheets

UNIVERSAL APPARATUS FOR DRIVING DIVERSE FANS

BACKGROUND OF THE INVENTION

1. Field of Invention

The present invention relates to an apparatus for identifying and driving diverse fans coupled to a computer system, and more particularly, to an apparatus that identifies fan types by the processed speed signals of the diverse fans.

2. Related Art

Currently, various components configured on a mother board would generate heat when operating, especially for those high-performance computing systems. Although some new heat-dissipation systems such as liquid cooling systems are available for specific applications now, conventional fans are still very common in computers.

Generally, a fan has a power connector for connecting to a power receptacle on a mother board, thereby utilizing electricity from a computer system and operating under system control. Two common types of the power receptacles have 3 and 4 pins respectively for configuring two types of diverse fans, which are so-called 3-pin fan and 4-pin fan. As shown in FIG. 1A, the receptacle 530 for the 3-pin fan has a ground pin Jg, a power pin Jp and a speed detection pin Jd, while the receptacle 510 for 4-pin fan has the fourth speed control pin Jc, as shown in FIG. 1B. Correspondingly, the power connector of a 3-pin fan has a ground contact, a power contact and a speed detection contact, while in a 4-pin fan the power connector has an additional speed control contact except the former three ones. Other differences for 3-pin and 4-pin fans are control circuits and control mechanism.

In the prior art, both 3-pin and 4-pin fans receive power (electricity) via the power contacts. To provide corresponding heat-dissipation performances under different system temperatures, the fans need to operate at corresponding speeds controlled by the computer system.

The 4-pin fan has the dedicated speed control contact for speed control, while the 3-pin fan uses the power contact to control speed. Most computer systems input pulse width modulation (PWM) signals to the speed control contact of the 4-pin fan, which is capable of control fan speed without effecting power supply through the power pin Jp. However, for the 3-pin fan, the PWM signal is input to the power switch 520 to keep the power switch 520 ON during the time period. Thus, the time period of power inputting through the power contact is controlled. So does the speed of the 3-pin fan.

Comparing to the continuous power supply mechanism of the 4-pin fan, aforesaid intermittent mechanism substantially influences the operation of the 3-pin fan and makes the speed control unstable. Except the duty cycle (DC) of the PWM signal is 100%, other DCs have a time period that the power switch is OFF, which means the 3-pin fan will be lack of electricity to output speed signals "Tachometer" through the speed detection contact of the power connector and the speed detection pin Jd of the receptacle. Meanwhile, a hardware monitor controller will fail to obtain correct speed from output speed signals. In fact, the difference between the speed obtained by the hardware monitor controller and the real speed of the 3-pin fan could be different up to 2 times. Accordingly, the 3-pin fan cannot reach a given speed responding to a specific system temperature, or remain at the same speed. The system components, consequently, are easily over-heated and damaged. Certainly it is the same for the 3-pin fan.

However, considering cost and system demands, the 3-pin fans are still very useful. For the two types of fans with different specifications and different control mechanisms, no computer system in the prior art is capable of identifying and driving both the two fans.

SUMMARY OF THE INVENTION

To solve the technical problems mentioned above, the present invention provides a universal apparatus for identifying and driving diverse fans that are different in speed control.

In an embodiment of the present invention, a universal driving apparatus is disclosed to identify and drive a first fan or a second fan. The driving apparatus includes a receptacle, a power switch, an integrator and a comparator. The receptacle is for connecting one of the first fan and the second fan. The receptacle comprises a power pin, a speed detection pin and a speed control pin. The power pin is for transmitting a drive voltage to the first fan or the second fan and for controlling rotation speed of the second fan. The speed detection pin is for providing a speed signal of the first fan or the second fan. The speed control pin is for transmitting the speed control signal to control rotation speed of the first fan. The power switch connects to the power pin and continuously/intermittently transmits the drive voltage to the power pin according to the power signal. The integrator is in circuit connection with the speed detection pin of the receptacle, and integrates the speed signal to obtain an integrated-speed voltage. The comparator is in circuit connection with the integrator and compares the integrated-speed voltage with a comparative voltage for outputting a comparative signal. Eventually, the computer system identifies whether the first fan or the second fan is configured to the receptacle and drives the configured fan according to the comparative signal.

In an embodiment according to the present invention, the driving apparatus further comprises a gate for circuit connecting the power switch and receiving the power signal to control the power switch. In addition, the gate is controlled by a gate control signal, while the computer system adjusts the gate control signal according to the comparative signal.

In another embodiment according to the present invention, the driving apparatus further comprises a first latch, which is in circuit connection with the gate and the comparator to receive the comparative signal and control the gate. In addition, the first latch is switched between statuses by the comparative signal only in a certain identifying period.

In another embodiment according to the present invention, the driving apparatus further comprises a second latch, which is in circuit connection with the power switch and the comparator for receiving the comparative signal to control the power switch. In addition, the second latch is switched between statuses by the comparative signal only in a certain identifying period.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow illustration only, and thus are not limitative of the present invention, and wherein.

DETAILED DESCRIPTION OF THE INVENTION

Figure 1B:
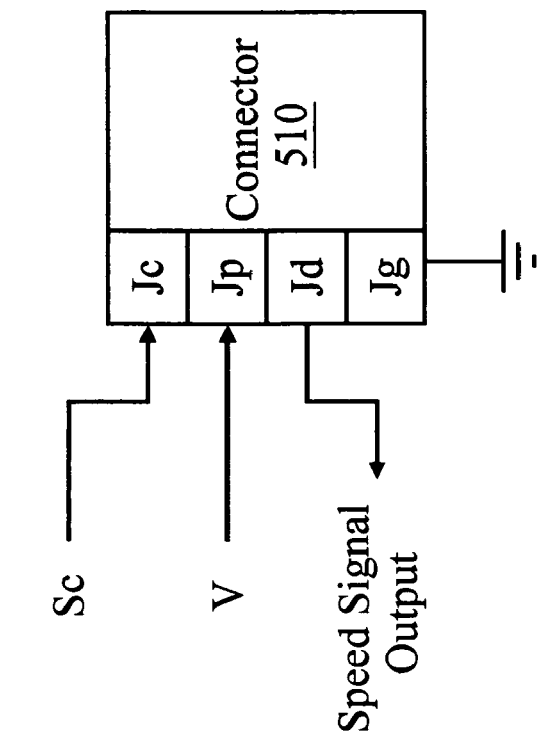
FIG. 1B shows a block diagram of a driving apparatus for a 4-pin fan according to the prior art.
Figure 1A:
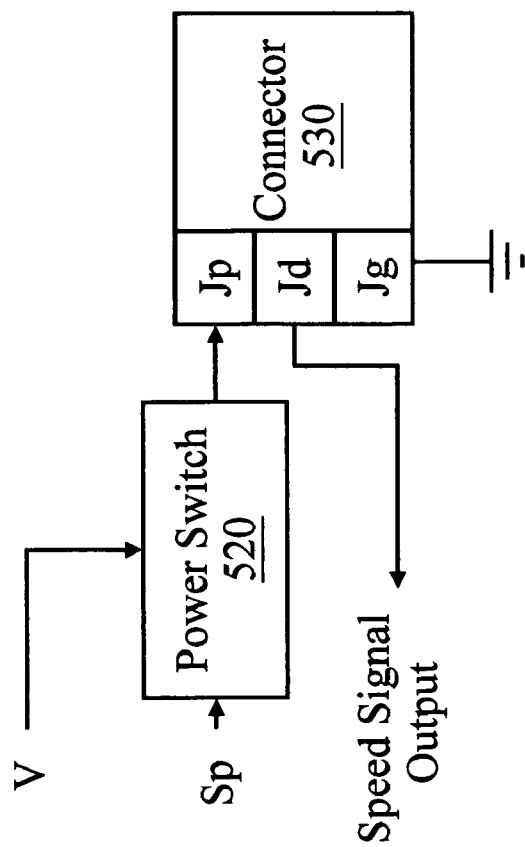
FIG. 1A shows a block diagram of a driving apparatus for a 3-pin fan according to the prior art.
Figure 2A:
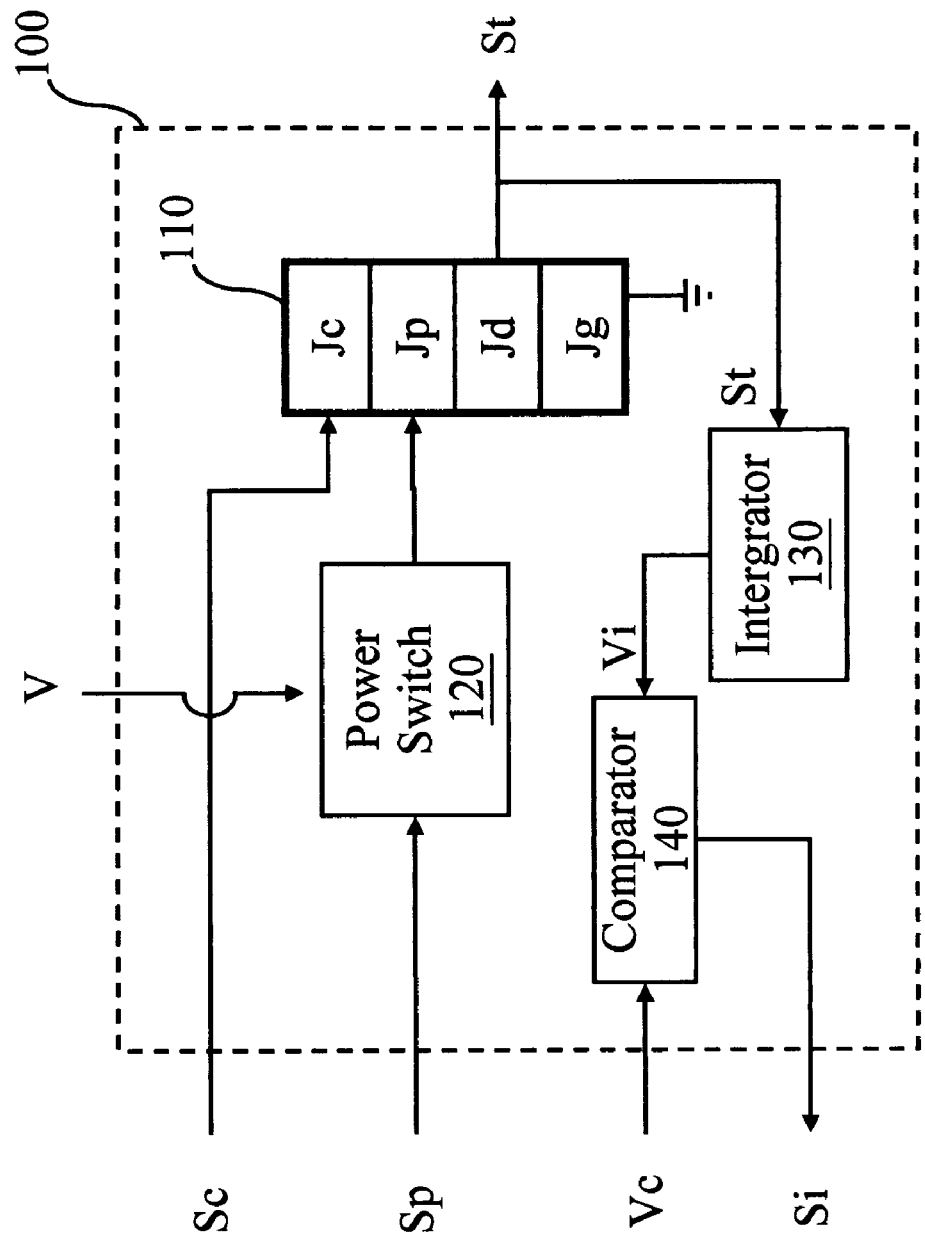
FIG. 2A shows a block diagram of a universal driving apparatus according to an embodiment of the present invention.

Please refer to FIG. 2A. The driving apparatus 100 includes a receptacle 110, a power switch 120, an integrator 130 and a comparator 140 that are all configured on a mother board of a computer system (not shown) to drive a first fan (not shown) and a second fan (not shown).

The receptacle 110 is provided for connecting one of the first fan and the second fan. The receptacle 110 has a power pin Jp, a detection pin Jd, a speed control pin Jc and a ground pin Jg. The pin sequence of the receptacle is corresponsive to the contacts of the first fan and the second fan to match each other and enable the first fan and the second fan to operate normally.

A power connector (not shown) of the first fan includes a first power contact, a first detection contact, a speed control contact and a first ground contact (all not shown) that are arranged in a linear sequence. The power connector of the second fan also has linearly-arranged contacts including a second power contact, a second detection contact and a second ground contact (all not shown) with the same sequence order as the first fan. The first power contact of the first fan and the second power contact of the second fan are for inputting electricity. The first detection contact of the first fan and the second detection contact of the second fan output their speed signals St, while the speed control contact of the first fan is for speed control. The power connectors of the first fan and the second fan have a similar specification. One of the differences is that the second fan lacks for the speed control contact of the first fan. Another difference is the second fan uses the second power contact for speed control. In practice, the first fan is compatible with 4-pin fan, while the second fan is compatible with 3-pin fan.

The power pin Jp is provided for connecting the first power contact of the first fan or the second power contact of the second fan. The power pin Jp receives a drive voltage V controlled by the power switch 120 and transmits to the first power contact of the first fan or the second power contact of the second fan. Except power supply, the power pin Jp is utilized to control rotation speed of the second fan.

The speed detection pin Jd is to connect the first detection contact of the first fan or the second detection contact of the second fan. Generally, the speed detection pin Jd is in circuit connection with a hardware monitor controller (not shown), and outputs a speed signal (signal "Tachometer") St from the first detection contact of the first fan or the second detection contact of the second fan to the hardware monitor controller. The hardware monitor controller calculates and records rotation speeds of the first fan and the second fan, thereby providing operation data of fans to a basic input/output system (BIOS, not shown).

The speed control pin Jc connects to the speed control contact of the first fan and transmits a speed control signal Sc to control rotation speed of the first fan. In practice, the speed control signal Sc is compatible with a PWM signal received from the hardware monitor controller. The speed control signal Sc can also be transmitted from the BIOS to the speed control pin Jc through a general purpose input/output (GPIO) pins (not shown) of the Southbridge chip or the floppy disk controller.

The ground pin Jg is for grounding the fans. The first ground contact of the first fan and the second ground contact of the second fan are not necessary. Any kind of ground structures is compatible to apply to the present invention. About the realization of the receptacle pins and the contacts of the fans, the present invention should not be limited to any type/amount/arrangement of the pin/contact disclosed in any embodiment of the present invention.

The power switch 120 is a transistor switch connected to the power pin Jp, which continuously or intermittently provides the drive voltage V to the power pin Jp according to the power signal Sp. Similar to the speed control signal Sc, the power signal Sc may be provided from the GPIO pins of a hardware monitor controller, a Southbridge chip or a floppy disk controller, to the power switch 120. The power signal Sc is a PWM signal or alternatives determined by demand. For the second fan, the power switch 120 is turned ON according to the duty cycle (DC) of the power signal Sp. 100% DC (full DC) of the power signal Sp means the power switch 120 remains ON continuously to enable the second fan rotate with its maximum rotation speed, while 50% DC means in only half time the power switch is turned ON to allow the second fan rotating at about half of its maximum rotation speed. In the other hand, the power switch 120 always remains ON continuously when the first fan is configured.

The integrator 130 is in circuit connection with the speed detection pin Jd of the receptacle 110 and the comparator 140. The integrator 130 integrates the speed signal St output from the speed detection pin Jd in a certain period to obtain an integrated-speed voltage Vi and transmit to the comparator 140. The integrator according to the present invention proportions the integrated-speed voltage Vi to the voltage-time integral of the speed signal St, in practice the integrator is compatible with any types of OP-based (operation amplifier based) integrating circuits or an integrated circuit having equivalent functions.

The comparator 140 is to compare a comparative voltage Vc provided by the computer system and the integrated-speed voltage Vi mentioned above, thereby outputting a comparative signal Si for fan type identification. The designated value of the comparative voltage Vc can be determined by the duty cycle (DC) of the speed control signal Sc during the identifying procedure. For example, during a certain period for fan type identification, the comparative voltage Vc can be determined by an identifying speed, which is smaller than the maximum rotation speed of the second fan (under 100% DC of the power signal Sp) and greater than half rotation speed of the first fan (under 50% DC of the speed control signal Sc). Thus, an integrated voltage obtained from the speed signal of aforesaid identifying speed will be appropriate to be utilized as the comparative voltage Vc.

Since one of the major differences between the first fan and the second fan is the speed control mechanism, rotation speed of the second fan should be fixed to its maximum by continuously providing the drive voltage V; which means the power switch 120 should be remained ON continuously. Several methods are available to keep the power switch 120 ON during a certain identifying time. Meanwhile, the DC of the speed control signal Sc should be designed to allow the first fan rotating at another speed different from the maximum speed of the second fan. Then two types of fans can be differentiated. Namely, when the receptacle 110 is configured with the second fan, the speed is fixed at its maximum speed; when the first fan is configured, a non-FDC (non-full-duty-cycle; especially much smaller than 100%) of the speed control signal Sc may make the first fan rotate at a lower speed that differs from the second fan's maximum speed. For the two types of fans that have the same maximum speed, the present invention can perfectly differentiate if a proper comparative voltage Vc is assigned.

Figure 2B:
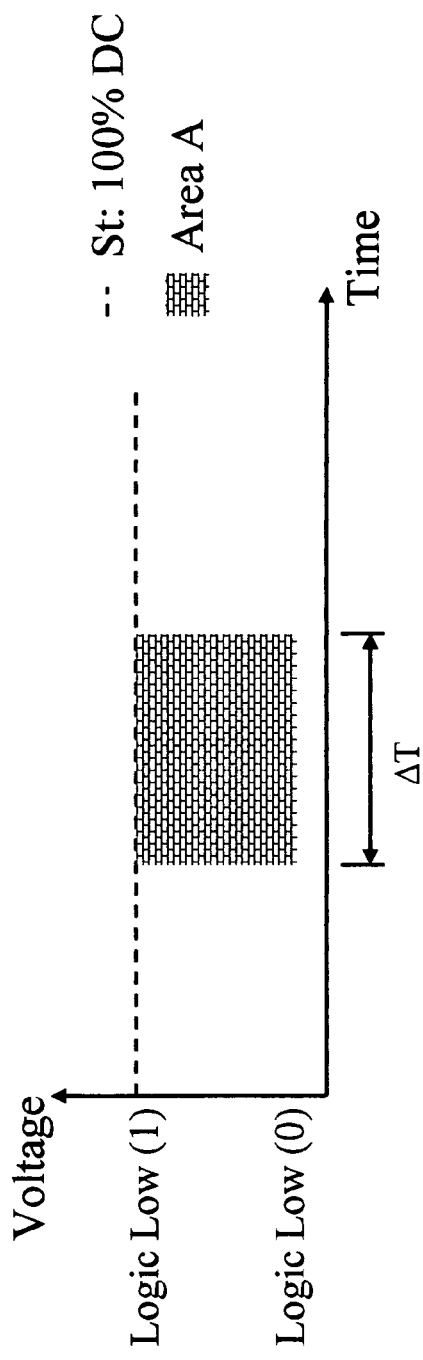
FIGS. 2B and 2C show voltage-time, dual-diagram comparison corresponsive to two different duty cycles of speed signals processed by the integrator.
Figure 2C:
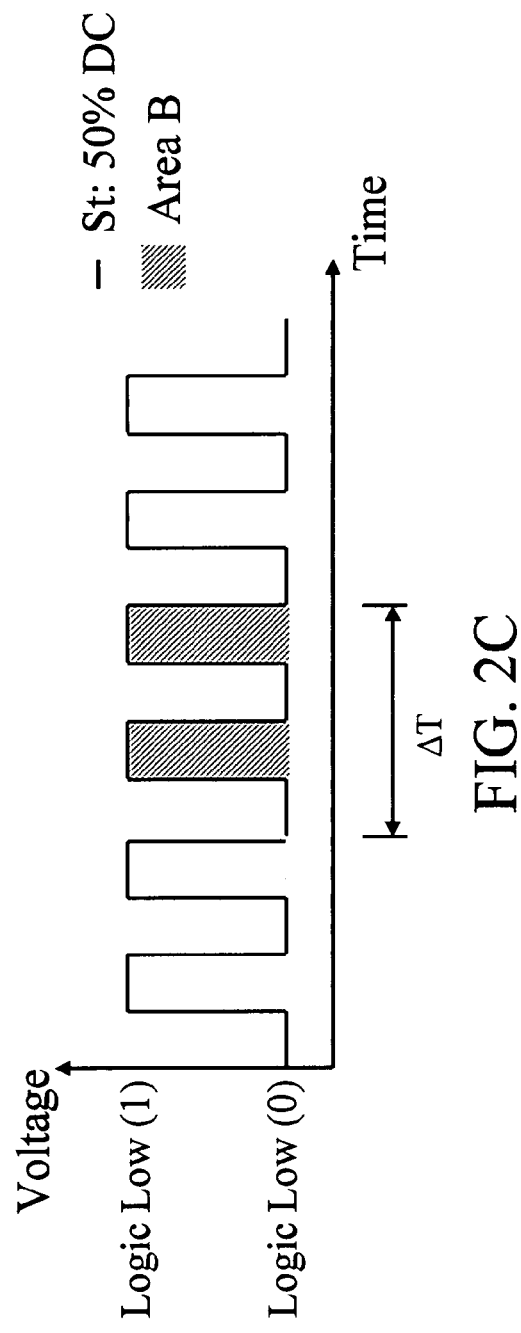

Please refer to FIGS. 2B and 2C. When the computer system is rebooted or reset, the BIOS first directly/indirectly transmits the speed control signal Sc with a non-FDC (non-full-duty-cycle), such as 50%, and remains only during a certain identifying period ΔT. Meanwhile, the power signal Sp forced the power switch 120 to remain ON (100% DC of the power signal Sp) and continuously provide the drive voltage V to the power pin Jp of the receptacle 110. When the first fan is configured, such control means will hold the first fan at a speed corresponsive to 50% DC of the speed control signal (generally around 50% of the first fan's maximum speed, depending on actual fan specification); while the second fan will be fixed at the maximum speed of the second. If the two fans have the same maximum speed, the two fans will have very obvious speed difference under above conditions. Since the speed signal St output by the speed detection pin Jd is also a PWM signal or the alternatives, the speed difference of the two speeds can be differentiated from their DC. In FIG. 2B, the horizontal dotted line represents a speed signal St with 100% DC, while the solid line with rise and fall represents a 50% DC speed signal St.

Next, the integrator 130 integrates the speed signal St during the identifying period ΔT to obtain an integrated-speed voltage Vi and transmit to the comparator 140 for comparing with the comparative voltage Vc. As shown in FIG. 2B, the speed signal St with FDC (100% DC) will have its integrated-speed voltage Vi equal to the area A under the dotted line. On the other hand, the speed signal St with 50% DC will have another integrated-speed voltage Vi equal to the area B under the solid line.

The integrated-speed voltage Vi will be compared in the comparator 140 with a designated comparative voltage Vc. The computer system can judge the relations between the integrated-speed voltage Vi and the comparative voltage Vc through the status (such as logic high/low) of the comparative signal Vi output by the comparator 140. Accordingly, fan type may be easily identified.

In an embodiment of the present invention, certain conditions are given as follows: (a) the first and the second fans have the same maximum speed; (b) the DC of the designated speed control signal Sc is 50% during the identifying period; (c) the expected identifying DC of the speed signal St for the first fan is also 50%, according to condition (b), to generate the speed integrated voltage Vi; and (d) the designated comparative voltage Vc is determined from the speed of 80% DC speed control signal. Then, the identifying and driving procedures perform as the following description.

(1) When the first fan is configured, a comparative signal Si with logic high will be output because Vc>Vi (80% DC>50% DC). Afterwards, the computer system controls the power signal Sp to remain the power switch 120 continuously turned ON. Meanwhile, rotation speed of the first fan is controlled by the speed control signal Sc.

(2) When the second fan is configured, the integrated-speed voltage Vi equivalent to 100% DC is greater than the comparative voltage Vc of 80% DC. Thus, the comparator 140 outputs a comparative signal Si of logic low, thereby allowing the computer system to control the speed of the second fan by adjusting the DC of the power signal Sp. Without the speed control contact, the second fan will not be affected by the speed control signal Sc. The computer system may still cancel the speed control signal Sc for any necessity.

In the present invention, the comparative signal Si may be directly/indirectly transmitted to the BIOS, the hardware monitor controller or alternative electrical components for adjusting the power signal Sp to make the power switch supplies electricity continuously (DC=100%) or intermittently (DC<100%). Namely, the computer system indirectly controls the power switch according to the comparative signal Si.

Figure 3:
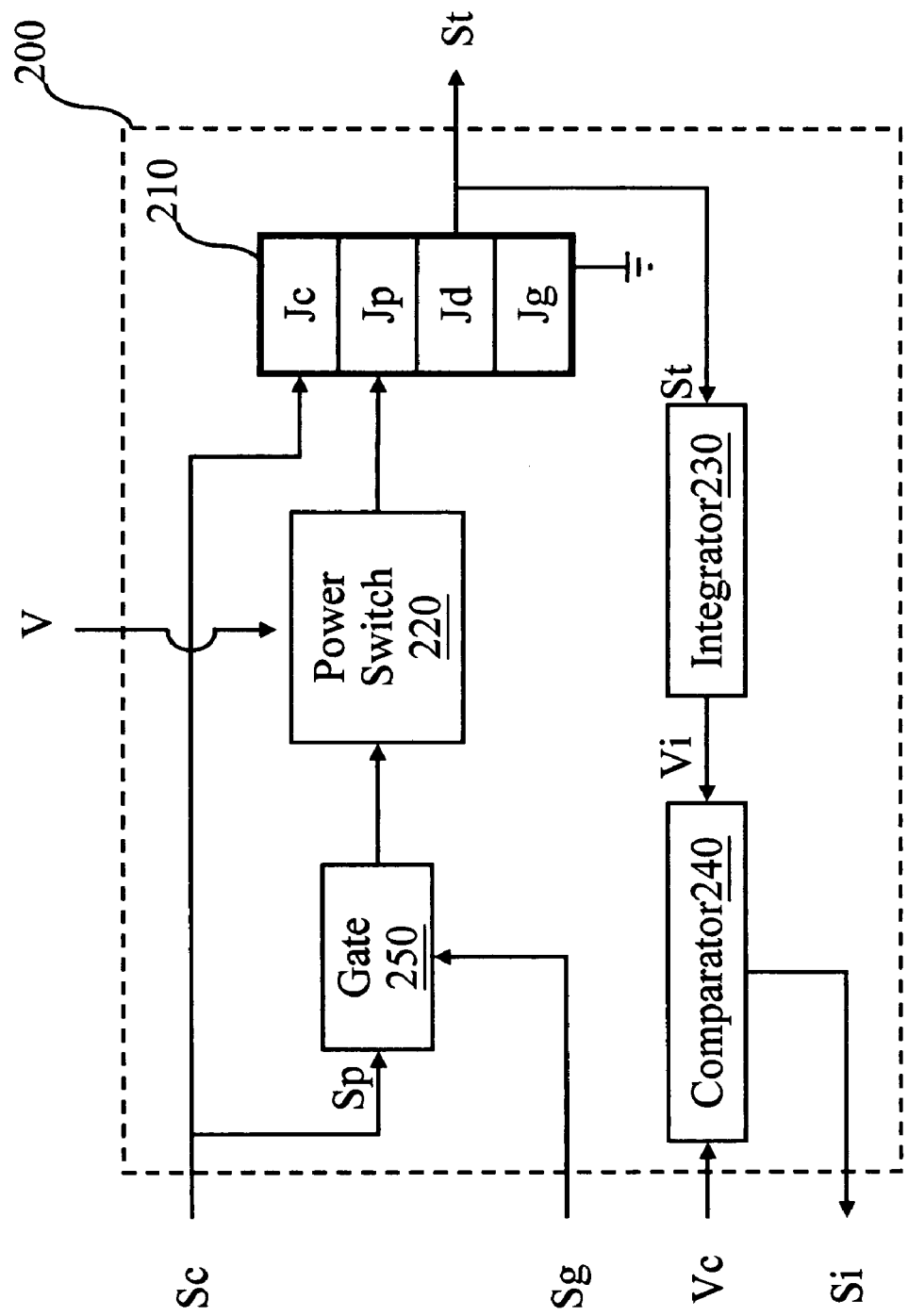
FIG. 3 shows a block diagram of a universal driving apparatus according to another embodiment of the present invention.

Please refer to FIG. 3. To simplify the signal control for the first and the second fans the power signal Sp and the speed control signal Sc may be combined. Also, the driving apparatus 200 configures a gate 250 to receive the power signal Sp and control the power switch 220. A gate control signal Sg will be used to control the status of the gate 250. According to the identifying result of the comparative signal Si, the gate control signal Sg keeps the power switch 220 turned ON (continuously supplying power) when the first fan is configured. If the second fan is configured, the gate 250 is released to allow the speed control signal Sp control rotation speed of the second fan. In practice, the power signal Sp may be alternative signals transformed from the speed control signal Sc. The gate control signal Sg may be provided by the hardware monitor controller, or originally generated by the BIOS and transmitted to the gate 250 through GPIO pins of the Southbridge chip or the floppy disk controller. In practice the type of the utilized gate depends on the actual demand of circuit design. The invention should not be limited by certain types of gates.

Figure 4:
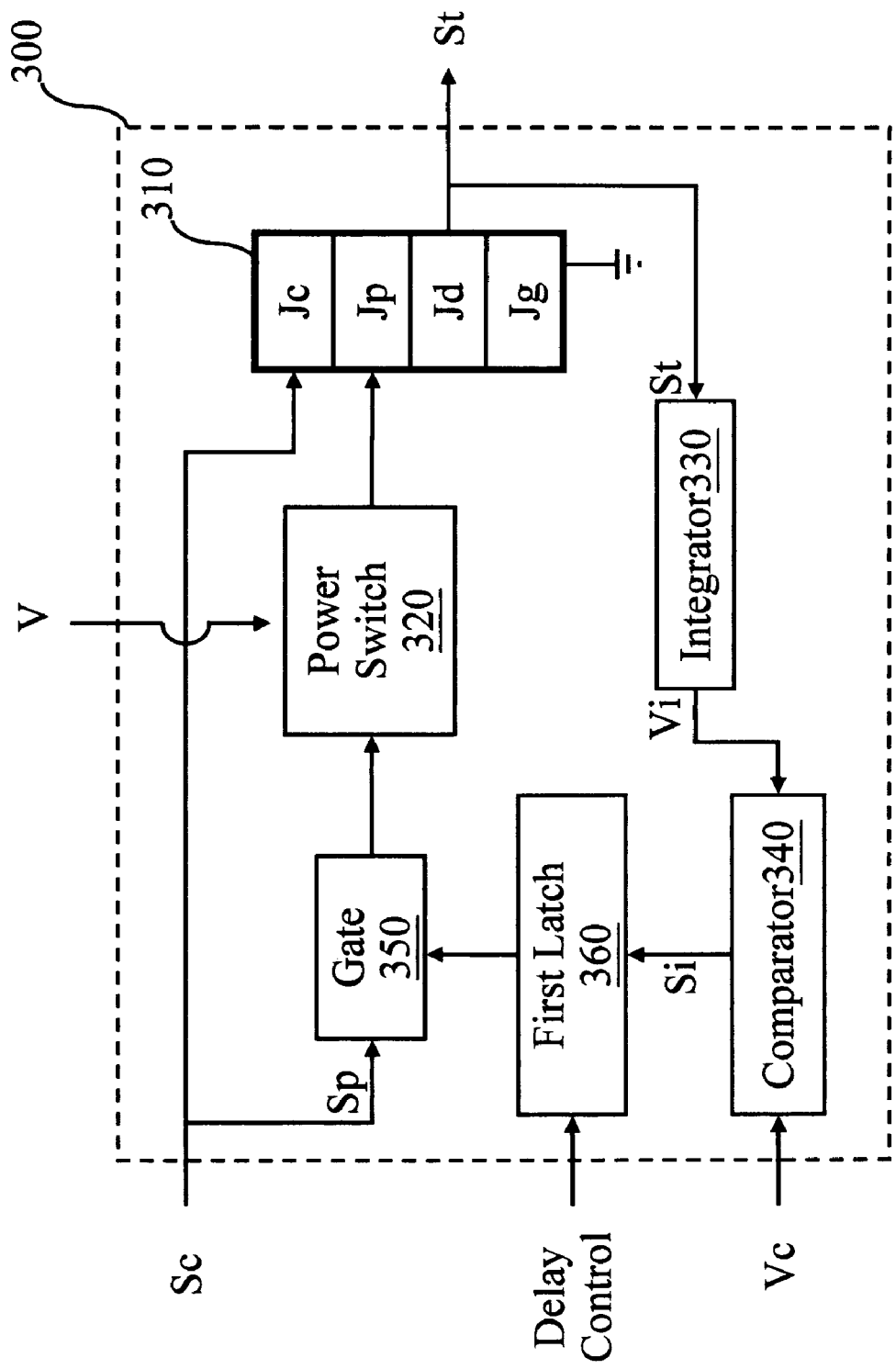
FIG. 4 shows a block diagram of an universal driving apparatus according to another embodiment of the present invention.
Figure 5:
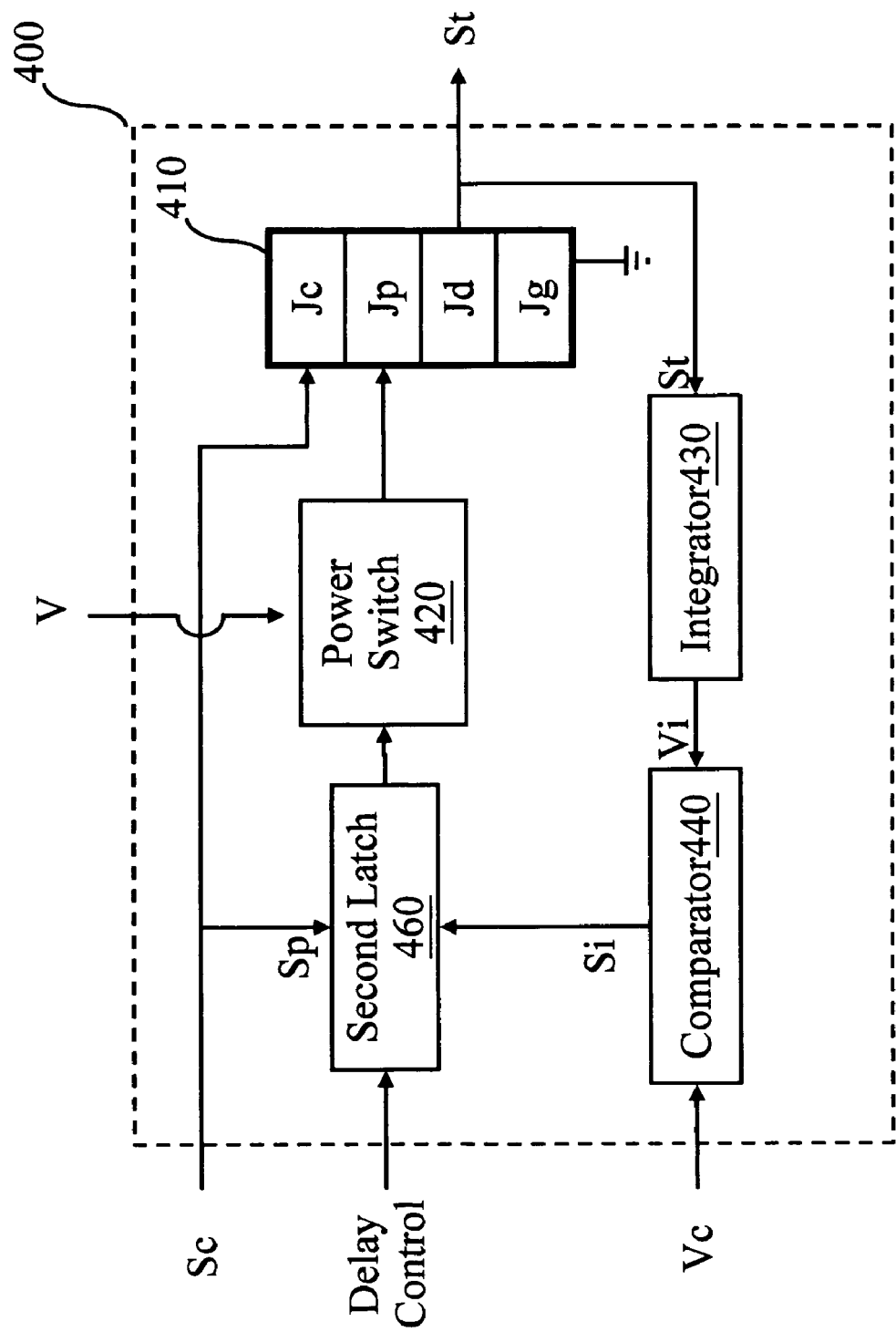
FIG. 5 shows a block diagram of a universal driving apparatus according to another embodiment of the present invention.

Please refer to FIG. 4. To reduce managing procedures for the BIOS or the computer system, in driving apparatus 300, a first latch 360 is in circuit connection with the comparator 340 and the gate 350. The comparator 340 transmits the comparative signal Si to the first latch 360 to control the status of the gate 350. The first latch 360 is under a delay control by the BIOS, RC delay (Resistance Capacitance Time Delay), alternative delay circuits or equivalent integrated circuits, thereby enabling the first latch 360 to switch between different statues only during the certain identifying period. Afterwards, the first latch 360 is locked to certain status. During the identifying period, if the first fan is configured, the first latch 360 is controlled by the comparative signal Si to lock the gate 350 for remaining the power switch 320 turned ON and supplying power continuously.

Oppositely, if the second fan is configured, the first latch 360 will lock the gate 250 to enable the speed control signal Sp to control the power switch 320 and rotation speed of the second fan.

Please refer to FIG. 4. The driving apparatus 400 removes the gate 350 in FIG. 4 away and utilize the second latch 460 to control the power switch 420 directly. The second latch 460 is also under a delay control similar to the first latch 360.

In the present invention, the first and the second latches 360, 460 may realized by latch circuits, flip-flops or equivalent integrated circuits.

According to the present invention, all alternative driving apparatuses that utilize the integrator and the comparator to process the speed signal for identifying 3-pin fan and 4-pin fan should be involved in the scope of the present invention.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An apparatus applying to a computer system for driving a first fan or a second fan, rotation speed of the first fan being controlled by a speed control signal, rotation speed of the second fan being controlled by a power signal, the apparatus comprising:
    a receptacle for connecting one of the first fan and the second fan, comprising a power pin, a speed detection pin and a speed control pin, wherein the power pin is for transmitting a drive voltage to the first fan or the second fan and for controlling rotation speed of the second fan, the speed detection pin providing a speed signal of the first fan or the second fan, the speed control pin transmitting the speed control signal to control rotation speed of the first fan;
    a power switch connecting to the power pin, controlling the drive voltage to continuously/intermittently transmit to the power pin according to the power signal;
    a integrator in circuit connection with the speed detection pin of the receptacle, integrating the speed signal to obtain a integrated-speed voltage; and
    a comparator in circuit connection with the integrator, comparing the integrated-speed voltage with a comparative voltage for outputting a comparative signal;
    wherein the computer system identifies whether the first fan or the second fan is configured to the receptacle according to the comparative signal.

2. The apparatus of claim 1, wherein the computer system adjust the power signal according to the comparative signal for controlling the power switch.

3. The apparatus of claim 1 further comprising a gate in circuit connection with the power switch for receiving the power signal and controlling the power switch.

4. The apparatus of claim 3, wherein the gate is controlled by a gate control signal, the computer system adjusting the gate control signal according to the comparative signal.

5. The apparatus of claim 3 further comprising a first latch in circuit connection with the gate and the comparator to receive the comparative signal and control the gate.

6. The apparatus of claim 5, wherein the first latch is under a delay control to be switched between statuses by the comparative signal only in a certain identifying period.

7. The apparatus of claim 1 further comprising a second latch in circuit connection with the power switch and the comparator.

8. The apparatus of claim 7, wherein the second latch receives the comparative signal to control the power switch.

9. The apparatus of claim 8, wherein the second latch is under a delay control to be switched between statuses by the comparative signal only in a certain identifying period.

10. The apparatus of claim 1, wherein the power signal is transformed from the speed control signal.

11. The apparatus of claim 1, wherein the receptacle further comprising a ground pin.

12. The apparatus of claim 1, wherein the comparative signal is output to a basic input/output system (BIOS) or a hardware monitor controller.

* * * * *